United States Patent
Wu

Patent Number: 5,758,269
Date of Patent: May 26, 1998

[54] HIGH-EFFICIENT CONFIGURABLE POWER AMPLIFIER FOR USE IN A PORTABLE UNIT

[75] Inventor: Howard X. Wu, Freehold, N.J.

[73] Assignee: Lucent Technologies Inc., Murray Hill, N.J.

[21] Appl. No.: 413,665

[22] Filed: Mar. 30, 1995

[51] Int. Cl.$^6$ .................................................. H01Q 11/12
[52] U.S. Cl. .......................... 455/127; 455/115; 455/38.3; 455/126
[58] Field of Search .................................. 455/38.3, 115, 455/127, 70, 343, 126; 330/129, 51, 150

[56] References Cited

U.S. PATENT DOCUMENTS

| | | | |
|---|---|---|---|
| 4,794,343 | 12/1988 | Yang | 330/129 |
| 5,126,688 | 6/1992 | Nakanishi et al. | 455/126 |
| 5,128,629 | 7/1992 | Trinh | 455/126 |
| 5,175,871 | 12/1992 | Kunkel | 455/127 |
| 5,432,473 | 7/1995 | Mattila et al. | 455/127 |
| 5,438,683 | 8/1995 | Durtler et al. | 455/126 |
| 5,467,055 | 11/1995 | Wray et al. | 455/126 |
| 5,530,923 | 6/1996 | Heinonen et al. | 455/127 |
| 5,550,895 | 8/1996 | Burson et al. | 455/33.1 |

*Primary Examiner*—Reinhard J. Eisenzopf
*Assistant Examiner*—Gertrude Arthur

[57] ABSTRACT

A high-efficient configurable power amplifier suitable for use in amplifying a signal for wireless transmission by a portable unit is provided. The amplifier provides a variable power output level, maximum efficiency of operation and battery power savings for the portable unit. The configurable power amplifier includes a plurality of amplifier stages with each stage having its own output configuration so that a selected number of desired output power levels for the power amplifier may be obtained directly from a selected amplifier stage. The amplifier stages also may be configured in tandem such that the output of a first amplifier stage serves as an input to a second amplifier stage, and so forth, in order to obtain a broad range of selectable power output levels while maintaining the desired efficiency of operation. When not part of the amplifying circuitry, each one of unused amplifier stages is switched to an OFF state wherein essentially no operating power is consumed by an amplifier stage when in this state. By employing the configurable power amplifier, the size, cost, and weight of the portable unit may be substantially reduced through use of a smaller capacity and less expensive battery or, alternatively, the talk time may be substantially increased if the same capacity battery is used.

25 Claims, 3 Drawing Sheets

HIGH-EFFICIENT CONFIGURABLE POWER AMPLIFIER FOR USE IN A PORTABLE UNIT

TECHNICAL FIELD

This invention relates to portable communication units and, more particularly, to radio-frequency power amplifiers employed in such units.

BACKGROUND OF THE INVENTION

Portable units such as those employed in a cellular communication system have the capability of continually adjusting their radiated output power to a level just sufficient to maintain satisfactory wireless communications with a base station. Thus, when a user of a portable unit moves about in a geographical area, the radiated output power from the portable unit is automatically increased or decreased to maintain satisfactory communications with the base station. By way of example, when the portable unit is located at the outer limits of its communication range, the level of the received signal from the base station is at a minimum and the radiated output power from the portable unit is set to its maximum level. When the portable unit is located closer to the base station and communications may be satisfactorily maintained with less than the maximum available power, however, the radiated output power from the portable unit is decreased proportionally with the increased level of the received signal. Thus, the radiated output power in the portable unit may be adjusted due to a change in signal strength because of a change in distance between the portable unit and the base station. The radiated output power may also be adjusted because of signal strength fading and other losses that affect the receive signal quality.

Control of the radiated output power in the portable unit may be obtained through control circuitry located either within the portable unit or the base station. Such circuitry senses the received signal strength level from the other unit and provides a control signal for either increasing or decreasing the radiated output power level in the portable unit. If the control circuitry is located in the portable unit, control of the radiated output power level is direct. If the control signal is located in the base station, then a control signal is generated in the base station and transmitted to the portable unit for adjusting the radiated output power from the portable unit.

The radiated output power in the portable unit is typically provided by a radio-frequency power amplifier located therein. The efficiency of this power amplifier is determined by the ratio of the signal output power of the amplifier to the operating power provided to this amplifier by a battery in the portable unit. The power amplifier typically employed in currently available portable units has an efficiency of approximately 50 percent at its highest power level setting and less than 5 percent at its lowest power level setting.

Portable units such as those employed in a cellular system and obtaining operating power from a portable battery are all limited to some finite time period over which they can be operated without replacing or recharging the battery. While these portable units are monitoring a channel for receipt of an incoming call, operating power for these units is consumed from the battery at a low level. When these portable units are in use communicating with base stations, however, operating power from the portable battery is consumed at a much higher level. Statistically, the usage or "talk time" of portable units has been shown to most likely occur while a portable unit is operating at the lower radiated output power levels. This is due primarily to the placement of one or more base stations (cell sites) such that most users of portable units are located relatively close to these base stations during their talk time. In addition, as the subscriber population density increases and more base stations are installed, the geographical spacing between base stations is becoming smaller. This again allows the portable unit to operate at the lower radiated output power levels. Consequently, the portable unit is operated more often at the lower radiated output power levels with the corresponding low efficiencies obtained while operating at these levels. It is therefore desirable to improve the efficiency of the portable units while operating at these lower radiated output power levels and maintain the same level of efficiency while operating at the higher radiated output power levels.

SUMMARY OF THE INVENTION

In accordance with the invention, the above problem is resolved through use of a high-efficient configurable power amplifier arranged for use in a portable unit. Through use of this configurable power amplifier, the efficiency of the power amplifier may be substantially improved at lower radiated power output levels while being maintained at the higher radiated power output levels.

In one aspect of the described embodiment of the invention, the configurable power amplifier includes a plurality of amplifier stages with each stage having its own output configuration so that a selected number of desired output power levels for the power amplifier may be obtained directly from a selected amplifier stage. The amplifier stages also may be configured in tandem such that the output of a first amplifier stage serves as an input to a second amplifier stage, and so forth, in order to obtain a broad range of selectable power output levels while maintaining the desired increased efficiency.

In accordance with a second aspect of the described embodiment of the invention, when not part of the amplifying circuitry, each one or more unused amplifier stages is switched to an OFF state wherein essentially no operating power is consumed by an amplifier stage while in this state. By employing the configurable power amplifier, the size, cost, and weight of the portable unit may be substantially reduced through use of a smaller capacity and less expensive battery or, alternatively, the "talk" time may be substantially increased if the same capacity battery is used.

BRIEF DESCRIPTION OF THE DRAWING

The invention and its mode of operation will be more clearly understood from the following detailed description when read with the appended drawing in which.

Throughout the drawing, the same element when shown in more than one figure is designated by the same reference numeral.

DETAILED DESCRIPTION

Figure 1:
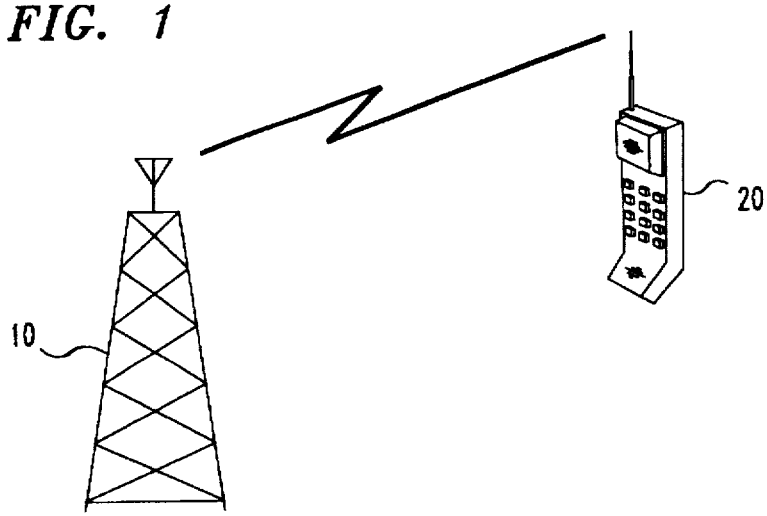
FIG. 1 is an illustration of a portable unit communicating with a base station in a communication system.

Referring now to FIG. 1, there is shown a base station 10 and a portable unit 20 between which wireless communications is provided over a communication channel in, for example, a cellular network. The base station 10 communicates with the portable unit 20 while the user of this portable unit is located within a geographical boundary of an associated cell in which radio coverage is provided by the base station. The cellular concept is well known and is described in general in the *Bell System Technical Journal*, Volume 58, Number 1, January 1979, and specifically in an article entitled *The Cellular Concept* by V. H. MacDonald, on pages 15 through 41 of this journal. An example of a portable unit suitable for use as portable unit 20 is cellular telephone Model 3770 manufactured by AT&T Corp.

The portable unit 20 has the capability of adjusting its radiated output power in accordance with the signal quality existing over a wireless communications link between it and the base station 10. Thus, as a user of a portable unit moves about in a geographical area, the radiated output power from the portable unit is automatically increased or decreased to maintain satisfactory communications with the base station. For example, when the portable unit is located at the outer limits of its communication range, the received signal quality from the base station is generally minimum and the radiated output power from the portable unit is set to its maximum level. When the portable unit is located closer to the base station and communications may be satisfactorily maintained with less than the maximum available power, however, the radiated output power from the portable unit is decreased proportionally with the increased signal quality of the received signal. Thus, the radiated output power in the portable unit is adjusted due to a change in signal quality because of a change in distance between the portable unit and the base station. The radiated output power is also adjusted because of signal strength fading and other losses that affect the receive signal quality.

Figure 2:
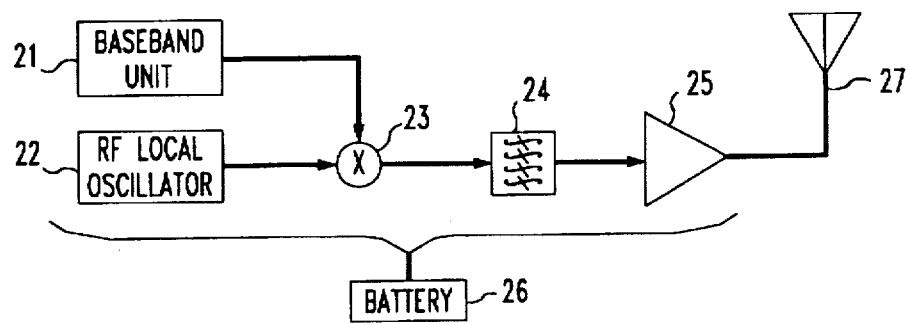
FIG. 2 is a block diagram of certain circuit sections of the portable unit of FIG. 1 used in communicating with a base station.

Referring next to FIG. 2, there is shown a block diagram of certain selected portions of the portable unit 20. Both a signal from a baseband unit 21 in the portable unit 20 and a signal from an RF local oscillator 22, also in the portable unit 20, are provided to a mixer 23. Voice and data control signals, obtained in a conventional and well-known manner, are modulated in the baseband unit 21 to produce an intermediate frequency (IF) signal. This IF signal is mixed in the mixer 23 with a carrier frequency which is generated by the RF local oscillator 22. From the mixer 23, an RF modulated signal is coupled to a filter 24 where any spurious and/or other unwanted signals are suppressed. From the filter 24, the filtered RF signal is coupled to a power amplifier 25 in order to boost the signal to the desired power output level. From the power amplifier 25, the RF signal is coupled to an antenna 27 for transmission over a radio-frequency link to the base station 10. Operating power to all circuit components in the portable unit 20 is provided by a portable battery 26 either inserted inside the housing of this unit or affixed to the housing in a manner whereby it conforms to and becomes a part of the overall housing for this unit.

Figure 3:
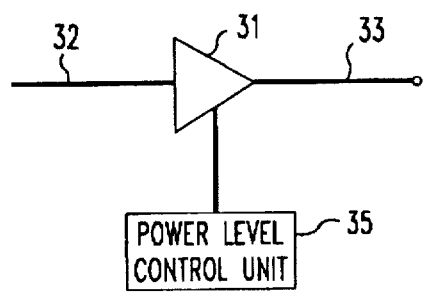
FIG. 3 is a prior art amplifier used in a portable unit for transmitting radio-frequency signals to a base station.

Referring next to FIG. 3, there is shown power amplifier 31 used in prior art portable units for amplifying an RF signal. Such amplifier is suitable for and has been used as amplifier 25 shown in FIG. 2 when a variable power output level is desired from a portable unit. The input to power amplifier 31 is provided on input line 32 and the output from this power amplifier is obtained on output line 33. For obtaining the variable power level from amplifier 31, a power level control unit 35 is employed. This power level control unit 35 controls the level of power generated by the power amplifier in accordance with a control signal that may be generated either locally in the portable unit or transmitted to the portable unit from the base station. Such power level control unit is capable of varying the output power of the power amplifier through, typically, 6 to 9 levels. However, the efficiency of this amplifier when operated at the lower output power levels is adversely affected. This is shown in the graph illustrated in FIG. 4 which shows efficiency as a function of output power of the amplifier 31 for a range of output power levels.

Figure 4:
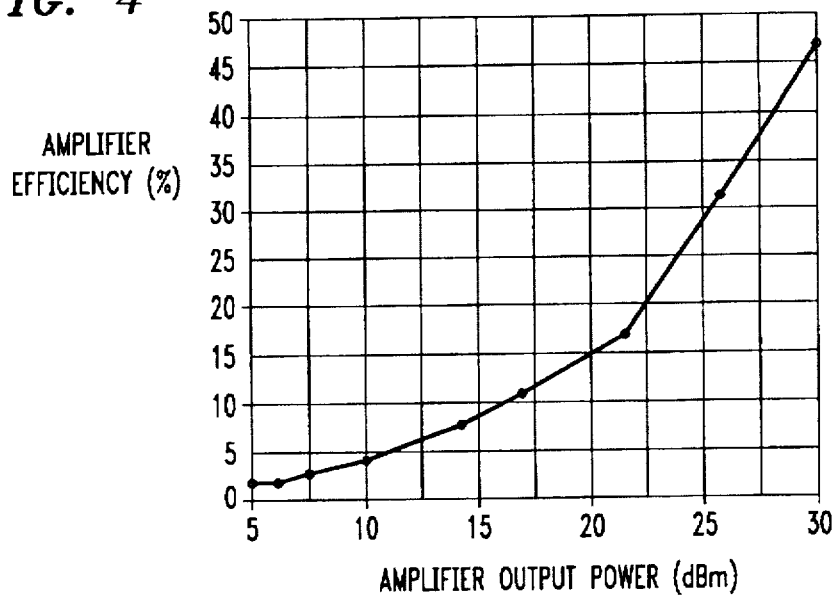
FIG. 4 is a graph for illustrating the efficiency of the prior art amplifier shown in FIG. 3 as a function of output power.

As shown in the graph of FIG. 4, the power amplifier 31 may have an efficiency of up to 50 percent at the highest output power level. As also shown in the graph, however, the power amplifier may have an efficiency of 5 percent or less at the lower output power levels. Such operation, unfortunately, occurs when the same power amplifier is configured to operate over a range of power output levels. Thus, even though the output power is appreciably decreased when the amplifier is configured to provide the low output power levels, the amount of input power provided by the battery to operate the amplifier is not proportionally decreased. With this type of operation, therefore, a battery used for providing operating power to the portable unit when operated primarily at low output power levels is unnecessarily depleted at a faster than necessary rate.

Figure 5:
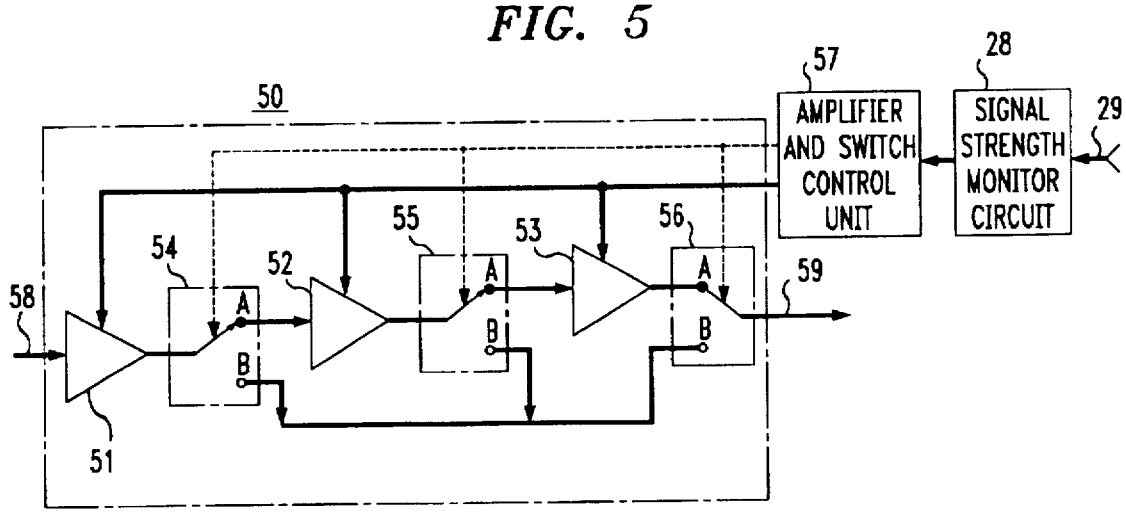
FIG. 5 is a configurable power amplifier suitable for use by the portable unit shown in FIG. 1 as one of the circuit sections shown in FIG. 2, in accordance with the invention.

Shown in FIG. 5, in accordance with the invention, is a reconfigurable power amplifier 50 suitable for use as amplifier 25 shown in FIG. 2 when a variable power output level, maximum efficiency of operation and battery power savings from a portable unit are desired. The reconfigurable power amplifier 50 includes a plurality of amplifier stages 51, 52, and 53, and associated switches 54, 55, and 56. Each stage has its own output configuration so that for achieving a desired output power level, the output from either one of these stages may be provided directly as the output of the power amplifier 50. The amplifier stages also may be configured in tandem such that the output of amplifier stage 51 provides an input to amplifier stage 52 and the output of amplifier stage 52 provides an input to amplifier stage 53, for example. Such arrangement advantageously permits a large range of power output levels while maintaining the desired increased efficiency. Additional amplifier stages may easily be incorporated in this circuitry for obtaining an even greater range of power output levels while maintaining the desired level of efficiency. Finally, when not part of the amplifying circuitry, one or more of these stages may be switched to an OFF state as selected by the amplifier and switch control unit 57 for providing the desired saving of battery power. Amplifier devices suitable for use as amplifier stages 51, 52 and 53 are available from Siemens Corp. respectively as part numbers, CGY-120, CLY-2 and CLY-10. And pin diodes suitable for use as switches 54, 55 and 56 are available from Hewlett Packard as part number HSMP-3894.

Figure 6:
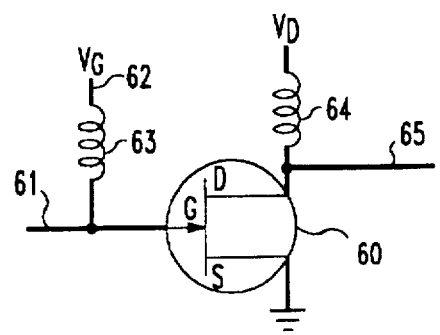
FIG. 6 is a transistor amplifier suitable for use by the configurable power amplifier shown in FIG. 5 as one of the gain stages of this amplifier, in accordance with the invention.

FIG. 6 shows how the gain is varied or changed in each one of the amplifier stages shown in FIG. 5 and also how the switching of each of these amplifier stages between an ON state and an OFF state is achieved. FIG. 6 shows a typical n-channel field-effect transistor (FET) 60 which may used for providing the amplification of each of the amplifier stages 51, 52 and 53 of the power amplifier 50. FETs are well known in the art. Examples of FETs being employed as power amplifiers are provided in a number of teachings in the art. An example of two such teachings is provided in *Designing With Field-Effect-Transistors*, Second Edition, by Siliconix Inc. 1990, McGraw-Hill, Inc., and *Power FETS and their Applications*, by E. S. Oxner, 1982, Prentice-Hall, Inc.

In operation, an input signal is provided on line 61 for amplification by the FET 60. This input signal is coupled to the gate (G) of the FET 60. Biasing of the gate (G) of the FET 60 is easily set by interjecting a voltage $V_G$ provided on a line 62 onto the gate (G) through an inductor 63. The voltage $V_G$ on line 62 is advantageously provided by the amplifier and switch control unit 57, shown in FIG. 5. When this voltage $V_G$ is reduced to a level lower than the pinch-off voltage for the FET 60, the FET 60 turns completely OFF and essentially no current flows between the drain (D), which is connected via an inductor 64 to a voltage $V_D$, and the source (S), which is connected to ground potential. The current flowing between drain (D) and source (S) of the FET 60 is negligible when this device is in the OFF state since the impedance for this type of device while in this state is typically $10^{12}$ ohms.

Moreover, when the voltage $V_G$ is set to specific selectable values by the amplifier and switch control unit 57, corresponding selected gain levels are provided in the FET 60 for amplifying the input signal provided on line 61. Thus, the variable gain levels that are selected by each of the amplification gain stages illustrated in FIG. 5 are selected by changing the voltage $V_G$ which is provided to the gate G of the FET 61. The amplified output signal of the FET 60 is provided on line 65. Although only one example of an amplifier circuit suitable for use in the amplifier stages 51, 52 and 53 of amplifier 50 is illustratively described, it is understood that other ways of providing variable amplification and OFF and ON switching in an amplifier circuit is possible and such operation is anticipated.

With the three illustrated amplifier stages, "N" amplification power levels are selectable. Although N is shown in the illustrated embodiment as 9, it is understood that fewer or greater number of power amplification levels may be selected in accordance with the invention. When an amplifier stage is not in the ON state providing amplification to the RF signal, the operating power to this amplifier stage is also switched off by the amplifier and switch control unit 57 thereby saving power in the battery which provides the operating power for the portable unit.

Referring once again to FIG. 5, connected to the amplifier and switch control unit 57 is a signal strength monitor circuit 28 which detects radio link quality for the portable unit 20. This signal strength monitor circuit 28 is capable of differentiating between a range of receive signal levels and may be, for example, a received signal strength indicator (RSSI) circuit. An RSSI circuit produces an output voltage that is proportional to the strength of the received signal from a remote unit. Through use of an analog-to-digital converter associated with the signal strength monitor circuit, a corresponding digital signal output representative of the strength of the receive signal is selected from within the range of receive signal levels and provided to the amplifier and switch control unit 57. The input for the signal strength monitor circuit 28 is obtained over line 29 from an RF conventional receiver (not shown) in the portable unit. Although the portable unit 20 is shown as having a signal strength monitor circuit 29 located therein, it is understood that this circuit could also be located in the base station 10 and the signal strength information transmitted from the base station to the portable unit in a control signal via a wireless communication link then existing between these two devices.

Figure 7:
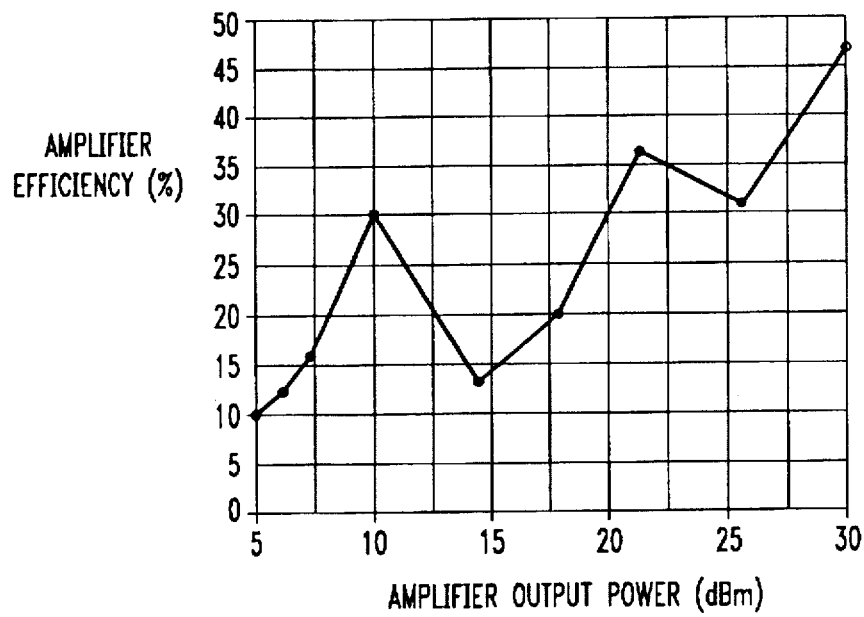
FIG. 7 is a graph for illustrating the efficiency of the amplifier shown in FIG. 5 as a function of output power.

In the operation of the power amplifier 50, a filtered RF modulated input signal is presented to amplifier stage 51 of this amplifier on input line 58. Amplifier stage 51 provides, for example, four levels of amplification to this input signal. These levels of amplification are those selectable by the amplifier and switch control unit 57 for providing the lower power output signal levels from the portable unit. Advantageously, when one of these four power output signal levels is selected, the operating power to amplifier stages 52 and 53 is turned OFF by the amplifier and switch control unit 57. These stages, when in this OFF state, advantageously do not require power from and thus do not deplete the battery. And switches 54, 55 and 56 are configured for coupling only the signal from the amplifier stage 51 to the output line 59 when the power amplifier 50 is in this first configuration. Thus, while in this first configuration, switch 54 routes the signal from amplifier stage 51 through its B port while switch 55 is configured for routing a signal through its A port. Since a signal is not present in amplifier stage 52 when the power amplifier 50 is in this first configuration, setting switch 55 in this manner prevents any undesirable loading of the signal being coupling from amplifier stage 51 to the output line 59. Finally, switch 56 is configured for coupling the signal from switch 54, this signal appearing on its B port, to the output line 59. The output power of the power amplifier 50 for the four low-power levels (5 through 10 dBm) available from amplifier stage 51 is illustrated in FIG. 7.

When the highest level of amplification available from amplifier stage 51 is insufficient for maintaining suitable communications between the portable unit 20 and the base station 10, such information is detected by the signal strength monitor circuit 28 which, in turn, reconfigures the amplifier and switch control unit 57 for providing intermediate radiated output power levels from the power amplifier 50. If the desired level of amplification is obtainable from amplifier stages 51 and 52 in tandem, then the amplifier and switch control unit 57 selectably turns on these amplifier stages and configures the switches for this second configuration of the power amplifier 50. Typically, three stages of intermediate amplification are available in amplifier stage 52. For this second configuration, amplifier stage 51 remains ON and its output is coupled through the A port of switch 54 to the input of amplifier stage 52. Amplifier stage 52 has its output coupled through the B port of switch 55 and switch 56 couples this output of amplifier stage 52, appearing on its B port, to the output line 59. In this configuration, not only is the amplifier stage 53 not used to amplify a signal, but this amplifier stage is not provided with operating power for those amplification levels provided solely by the amplifier stages 51 and 52. And when the amplifier stage 53 is turned OFF, the drain that would otherwise be placed on the battery is avoided. The output power of the power amplifier 50 for the three intermediate amplification levels (14 through 22 dBm) available from amplifier stage 52 is illustrated in FIG. 7.

If more power than is available from the tandem arrangement of amplifier stages 51 and 52 is still required from the portable unit 20 in order to maintain suitable communications with the base station 10, a third configuration of the power amplifier 50 is implemented by the signal strength and monitor circuit. Switches 54, 55 and 56 are reconfigurable to facilitate operation in this third configuration. Also, two high-power levels selectable by the amplifier and switch control unit 57 are available from the power amplifier 50 when the amplifier gain stage 53 is included as the final amplifier in the tandem arrangement of amplifier stages 51, 52 and 53. For this third configuration, switches 54 and 55 both route the signals provided from amplifier stages 51 and 52, respectively, to their A ports. Switch 56 is also configured to route the signal presented on its A port to the output line 59. The output power of the power amplifier 50 for the two high-power levels (26 through 30 dBm) available from the output of amplifier stage 53 is illustrated in FIG. 7.

Although a three-stage power amplifier has been shown and described, it is to be understood that power amplifiers having only two stages of amplification or more than three stages of amplification are possible and may be implemented without departing from the spirit and scope of the invention. For example, an increase in overall amplifier efficiency at the low-power levels as well as uniformity of efficiency between adjacent power levels may be achieved by increasing the number of amplifier stages in the power amplifier. Also, by varying the power applied to each of the amplifier stages, when used in tandem, the uniformity of efficiency between the amplification levels can be improved.

Figure 8:
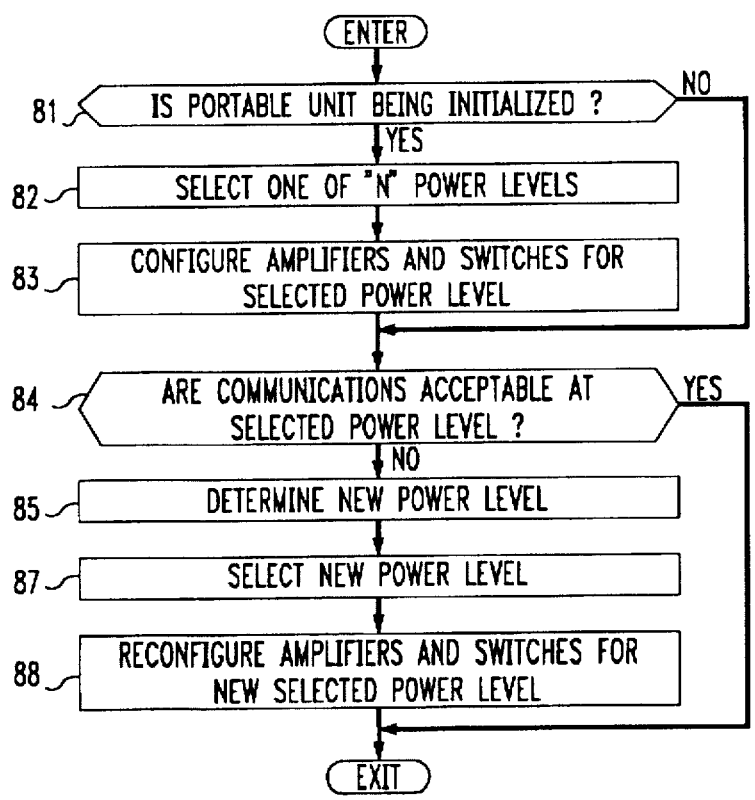
FIG. 8 is a flow diagram of a process suitable for incorporation into the portable unit of the communication system for executing power level switching of the configurable power amplifier shown in FIG. 5, in accordance with the invention.

Referring next to FIG. 8, there is shown a flow chart illustrating the operation of the amplifier and switch control unit 55 in executing the power level switching of the configurable amplifier 50 shown in FIG. 5. The functions provided by the amplifier and switch control unit 57 are advantageously determined by a process or program stored in memory contained in this unit.

The process in entered at decision 81 where a determination is made as to whether the portable unit is being initialized. The portable unit is initialized when it is first turned on or requires initializing for some reason. If the portable unit is not being initialized, then the process advances directly to decision 84. If the portable unit is being initialized, however, the process advances to step 82 where an initial one of multiple "N" power levels is selected. This selected power level serves as the default power level. Such power level is selected to typically provide the highest power level setting available in the portable unit. The highest power level is advantageously selected to assure that initial communications between the portable unit and the base station may be established. Other power levels, however, may be selected as the default power level if desired.

From the step 82, the process advances to step 83 where each one of the amplifiers is configured by being turned ON or OFF as appropriate, and the switches associated with the amplifiers are configured for selectively routing the radio frequency signal through the amplifiers for achieving the desired signal amplification level.

Once the amplifiers and switches are configured and communications is established, a test is performed by the process in decision 84 to determine whether the established communications is acceptable at the selected power level. This test includes determining whether suitable communications may be maintained at a lower power level, or (during subsequent executions of this process when a lower power level has been selected) at a higher power level. If communications is acceptable at the selected power level, the process is executed. If the communications is not acceptable at the selected power level, the process advances to step 85.

At step 85, a suitable new power level is determined which will provide the desired efficiency, power savings and still provide reliable operation of the communications link between the portable unit and the base station. From step 85, the process advances to step 87 where the new power level is selected in the amplifier and switch control unit 57. From step 87 the process advances to step 88 where the amplifier and switch control unit 57 reconfigure the amplifier and switches for the new selected power level. From step 88, the process is exited. This power level switching process is executed periodically, for example, every 60 seconds, to ensure that the radiated output power level from the portable unit 20 is adjusted to its optimum value for existing receive signal level conditions in order to achieve the desired efficiency and power savings in this portable unit.

Various other modifications of this invention are contemplated and may obviously be resorted to by those skilled in the art without departing from the spirit and scope of the invention. For example, the portable unit shown and described in the embodiment herein is operable in communicating with another remotely located portable unit in a communication system wherein two such portable units are configured to communicate with each other. Thus, it is apparent that the invention may be practiced other than as specifically disclosed in in the embodiment herein without departing from the spirit and scope of the invention as hereinafter defined by the appended claims.

I claim:

1. A portable telephone handset comprising:

means for transmitting a signal to a remotely located station while communicating over a wireless communication channel with said station;

power amplifying means for amplifying said signal for transmission to said remotely located station, said power amplifying means including a plurality of amplifier stages for amplifying said signal for transmission to each one of a plurality of selectable radiated output power levels;

signal strength monitoring means for monitoring the level of a received signal from said remotely located station and for selecting, responsive to the level of the received signal, one from said plurality of selectable radiated output power levels for said signal for transmission to said remotely located station;

control means for configuring said power amplifying means, said control means selectably activating one or more of the amplifier stages for amplifying said signal for transmission to said selected one of the plurality of selectable radiated output power levels; and switching means for selectably routing said signal for transmission to the one or more activated amplifier stages for amplifying said signal for transmission to said selected one of the plurality of selectable radiated output power levels, said selected radiated output power level for said signal for transmission being selected for maintaining suitable communications with said remotely located station.

2. The portable telephone handset as in claim 1 wherein the control means includes means for deactivating each one of the plurality of amplifier stages not used in amplifying said signal for transmission, the deactivating means turning off each deactivated amplifier stage so that essentially no operating power is consumed in each deactivated amplifier stage.

3. The portable telephone handset as in claim 2 wherein the switching means include means for routing said signal for transmission from the activated amplifier stages to an antenna for transmission to said remotely located station.

4. The portable telephone handset as in claim 2 wherein said plurality of amplifier stages are connected in a tandem configuration.

5. The portable telephone handset as in claim 4 further including means for activating said plurality of amplifier stages in said tandem configuration, a first amplifier stage in plurality of amplifier stages being activated first and a last amplifier stage in plurality of amplifier stages being activated last in said tandem configuration.

6. The portable telephone handset as in claim 5 wherein the means for activating said plurality of amplifier stages in said tandem configuration further includes means for activating one or more intermediate amplifier stages between the first and last amplifier stages in the plurality of amplifier stages, a first intermediate amplifier stage adjacent to the first amplifier stage being activated next after the first amplifier stage and a second intermediate amplifier stage adjacent to the last amplifier stage being activated after the first intermediated amplifier stage and before the last amplifier stage.

7. The portable telephone handset as in claim 2 wherein the control means includes means for selectably activating each one of the amplifier stages for obtaining multiple ones of the plurality of selectable power levels in each amplifier stage.

8. The portable telephone handset as in claim 7 wherein the plurality of amplifier stages includes three amplifier stages.

9. The portable telephone handset as in claim 7 wherein each one of the amplifier stages in said plurality of amplifier stages is a transistor amplifier.

10. The portable telephone handset as in claim 9 wherein each one of said transistor amplifiers is a field-effect transistor.

11. A method of operating a portable handset comprising the steps of:

transmitting a signal to a remotely located station while communicating over a wireless communication channel with said station;

amplifying in a power amplifier said signal for transmission to said remotely located station, said power amplifier including a plurality of amplifier stages for amplifying said signal for transmission to each one of a plurality of selectable radiated output power levels;

monitoring the level of a received signal from said remotely located station;

selecting, in response to the level of the received signal, one from the plurality of selectable radiated output power levels for said signal for transmission to said remotely located station;

configuring said power amplifier, said configuring step selectably activating one or more of the amplifier stages for amplifying said signal for transmission to one of the plurality of selectable radiated output power levels; and switching said signal for transmission selectively to the activated amplifier stages for amplifying said signal for transmission to said selected one of the plurality of selectable radiated output power levels, said selected radiated output power level for said signal for transmission being selected for maintaining suitable communications with said remotely located station.

12. The method of operating a portable handset as in claim 11 wherein the configuring step includes the step of deactivating each one of the plurality of amplifier stages not used in amplifying said signal for transmission, the deactivating step turning off each deactivated amplifier stage so that essentially no operating power is consumed in each deactivated amplifier stage.

13. The method of operating a portable handset as in claim 12 wherein the switching step include the step of routing said signal for transmission from the activated amplifier stages to an antenna for transmission to said remotely located station.

14. The method of operating a portable handset as in claim 12 wherein said plurality of amplifier stages are connected in a tandem configuration.

15. The method of operating a portable handset as in claim 14 further including the step of activating said plurality of amplifier stages in said tandem configuration, a first amplifier stage in the plurality of amplifier stages being activated first and a last amplifier stage in the plurality of amplifier stages being activated last in said tandem configuration.

16. The method of operating a portable handset as in claim 15 wherein the activating step for activating said plurality of amplifier stages in said tandem configuration further includes the step of activating one or more intermediate amplifier stages between the first and last amplifier stages in the plurality of amplifier stages, a first intermediate amplifier stage adjacent to the first amplifier stage being activated next after the first amplifier stage and a second intermediate amplifier stage adjacent to the last amplifier stage being activated after the first intermediate amplifier stage and before the last amplifier stage.

17. The method of operating a portable handset as in claim 12 wherein the configuring step includes the step of selectably activating each one of the amplifier stages for obtaining multiple ones of the plurality of selectable radiated output power levels in each amplifier stage.

18. The method of operating a portable handset as in claim 17 wherein the plurality of amplifier stages includes three amplifier stages.

19. The method of operating a portable handset as in claim 17 wherein each one of the amplifier stages in said plurality of amplifier stages is a transistor amplifier.

20. The method of operating a portable handset as in claim 19 wherein each one of said transistor amplifiers is a field-effect transistor.

21. In a portable unit including transmitter circuitry for transmitting a signal to a remotely located unit and a power amplifier for amplifying said signal for transmission to said remotely located unit, said power amplifier comprising:

a plurality of amplifier stages for selectably amplifying said signal for transmission to each one of a plurality of selectable radiated output power levels; and said portable unit comprising means for receiving signal strength control information in a received signal from said remotely located station and for selecting one from said plurality of selectable radiated output power levels for said signal for transmission to said remotely located station in response to receipt of said control information;

control means for configuring said power amplifier, said control means activating at least one of the amplifier stages for amplifying said signal to said selected one of the plurality of selectable radiated output power levels; and switching means for selectably routing said signal for transmission to the one or more activated amplifier stages for amplifying said signal for transmission to said selected one of the plurality of selectable power levels, said selected radiated output power level for said signal for transmission being selected for maintaining suitable communications with said remotely located station.

22. The power amplifier as in claim 21 wherein the control means includes means for deactivating each one of the plurality of amplifier stages not used in amplifying said signal for transmission, the deactivating means turning off each deactivated amplifier stage so that essentially no operating power is consumed in each deactivated amplifier stage.

23. The power amplifier as in claim 22 wherein the switching means include means for routing said signal for transmission from the activated amplifier stages to an antenna for transmission by the portable unit.

24. The power amplifier as in claim 22 wherein said plurality of amplifier stages are connected in a tandem configuration.

25. The power amplifier as in claim 24 further including means for activating said plurality of amplifier stages in said tandem configuration, a first amplifier stage in the plurality of amplifier stages being activated first and a last amplifier stage in the plurality of amplifier stages being activated last, and a first intermediate amplifier stage adjacent to the first amplifier stage being activated next after the first amplifier stage and a second intermediate amplifier stage adjacent to the last amplifier stage being activated after the first intermediated amplifier stage and before the last amplifier stage in said tandem configuration.

* * * * *